(12) United States Patent
Kim et al.

(10) Patent No.: US 8,302,270 B2
(45) Date of Patent: Nov. 6, 2012

(54) METHOD OF MANUFACTURING CAPACITOR-EMBEDDED PCB

(75) Inventors: Woon-Chun Kim, Suwon-si (KR); Sung Yi, Suwon-si (KR); Hwa-Sun Park, Suwon-si (KR); Hong-Won Kim, Suwon-si (KR); Dae-Jun Kim, Suwon-si (KR); Jin-Seon Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/929,234

(22) Filed: Jan. 10, 2011

(65) Prior Publication Data

US 2011/0099779 A1    May 5, 2011

Related U.S. Application Data

(62) Division of application No. 12/081,862, filed on Apr. 22, 2008, now Pat. No. 7,886,414.

(30) Foreign Application Priority Data

Jul. 23, 2007   (KR) .................. 10-2007-0073259
Nov. 7, 2007    (KR) .................. 10-2007-0113421

(51) Int. Cl.
   *H01G 7/00* (2006.01)
(52) U.S. Cl. ............ 29/25.42; 29/25.03; 29/25.41; 29/832; 29/853; 361/321.2; 361/311
(58) Field of Classification Search ............ 29/830–832, 29/846–847; 361/311, 321.1–321.4; 174/250, 174/262–264; 156/307.3–307.7, 278
See application file for complete search history.

(56) References Cited

U.S. PATENT DOCUMENTS

| | | | |
|---|---|---|---|
| 4,554,229 A * | 11/1985 | Small, Jr. .................. | 430/17 |
| 5,261,153 A | 11/1993 | Lucas et al. | |
| 5,592,737 A | 1/1997 | Middelman et al. | |
| 5,796,587 A * | 8/1998 | Lauffer et al. ............. | 361/763 |
| 6,606,793 B1 | 8/2003 | Dunn | |
| 6,657,849 B1 | 12/2003 | Andresakis et al. | |
| 6,693,793 B2 | 2/2004 | Kuwako et al. | |
| 6,839,219 B2 | 1/2005 | Mashiko et al. | |
| 6,910,266 B2 | 6/2005 | Lee et al. | |
| 7,203,055 B2 * | 4/2007 | Shin et al. ................. | 361/306.3 |
| 7,293,356 B2 * | 11/2007 | Sohn et al. ................. | 29/852 |
| 7,596,842 B2 | 10/2009 | Andresakis et al. | |
| 7,886,414 B2 * | 2/2011 | Kim et al. .................. | 29/25.42 |
| 2004/0188134 A1* | 9/2004 | Sato et al. ................. | 174/255 |
| 2009/0025195 A1 | 1/2009 | Kim et al. | |

FOREIGN PATENT DOCUMENTS

JP    1989-137693    5/1989
(Continued)

OTHER PUBLICATIONS

U.S. Appl. No. 12/081,862, filed Apr. 22, 2008, Woon-Chun Kim et al., Samsung Electro-Mechanics Co., Ltd.

(Continued)

*Primary Examiner* — Minh Trinh

(57) ABSTRACT

A method of manufacturing a capacitor-embedded printed circuit board that includes fabricating a capacitor substrate having at least one inner electrode formed on one side of a dielectric layer; aligning a semi-cured insulation layer with one side of a core layer, and aligning the capacitor substrate with the semi-cured insulation layer such that the inner electrode faces the semi-cured insulation layer; and collectively stacking the core layer, the semi-cured insulation layer, and the capacitor substrate.

5 Claims, 24 Drawing Sheets

FOREIGN PATENT DOCUMENTS

| | | |
|---|---|---|
| JP | 5-7063 | 1/1993 |
| JP | 2004-95804 | 3/2004 |
| JP | 2006-253656 | 9/2006 |
| JP | 2006-310822 | 11/2006 |
| JP | 2007-96312 | 4/2007 |

OTHER PUBLICATIONS

U.S. Patent Office Action, mailed Dec. 10, 2009, issued in corresponding U.S. Appl. No. 12/081,862.

U.S. Patent Office Action, mailed Apr. 9, 2010, issued in corresponding U.S. Appl. No. 12/081,862.

U.S. Patent Notice of Allowance, mailed Oct. 6, 2010, issued in corresponding U.S. Appl. No. 12/081,862.

Japanese Office Action issued Feb. 16, 2010 in corresponding Japanese Patent Application 2008-112500.

Japanese Office Action issued Jun. 22, 2010 in corresponding Japanese Patent Application 2008-112500.

* cited by examiner

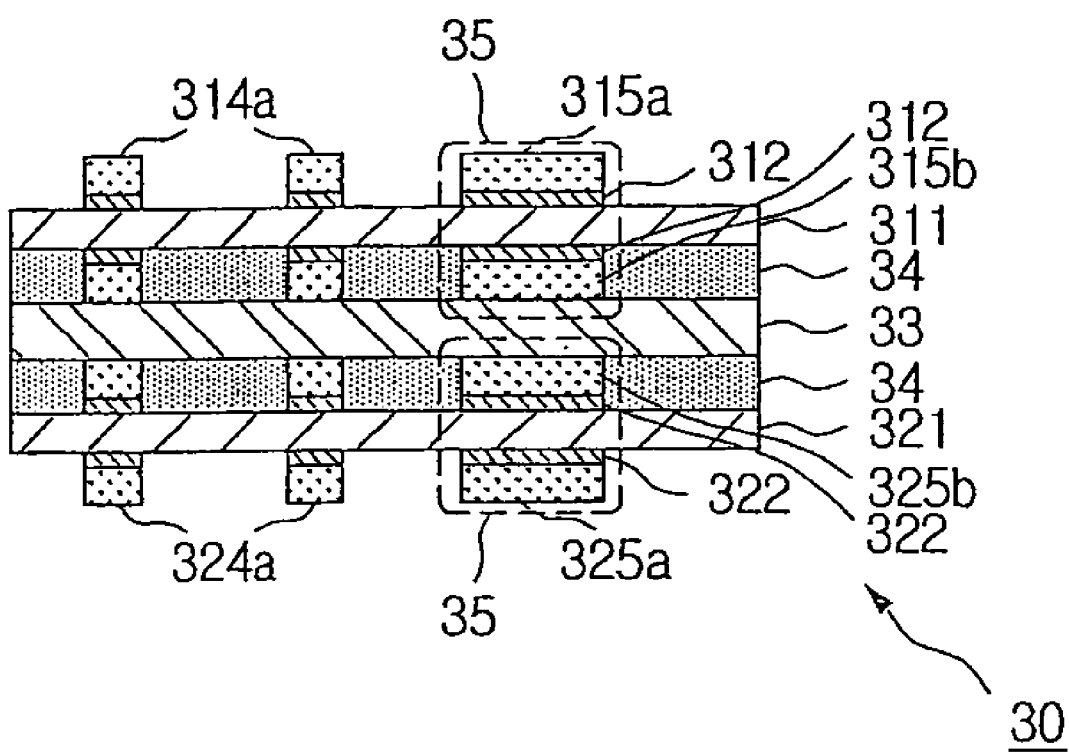

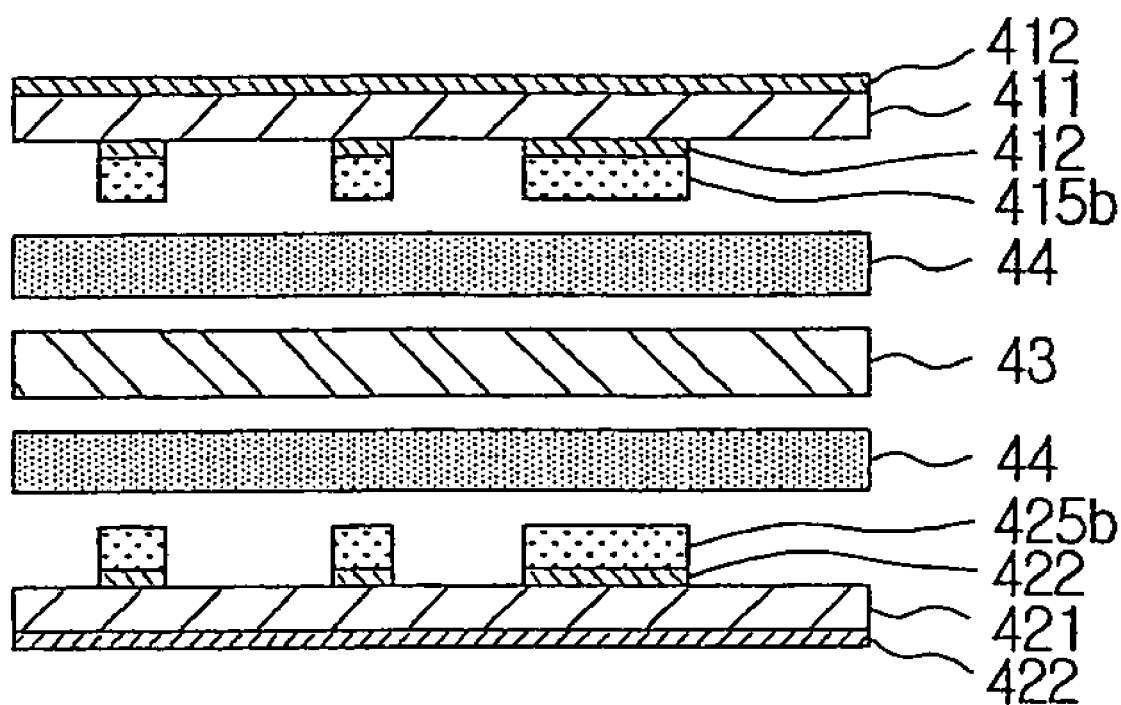

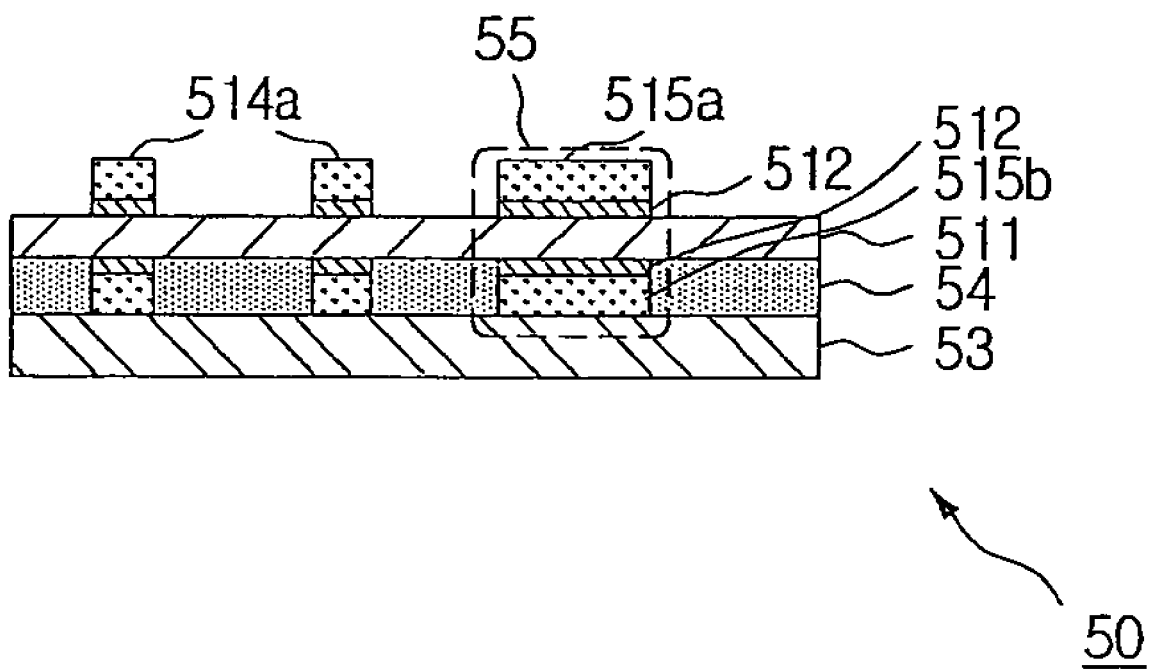

METHOD OF MANUFACTURING CAPACITOR-EMBEDDED PCB

CROSS-REFERENCE TO RELATED APPLICATIONS

This application is a U.S. divisional application filed under 37 USC 1.53(b) claiming priority benefit of U.S. Ser. No. 12/081,862 filed in the United States on Apr. 22, 2008, now issued as U.S. Pat. No. 7,886,414, which claims earlier priority benefit to Korean Patent Applications No. 10-2007-0073259 and No. 10-2007-0113421, filed with the Korean Intellectual Property Office on Jul. 23, 2007, and Nov. 7, 2007, the disclosures of which are incorporated herein by reference.

BACKGROUND

1. Field

The present invention relates to a capacitor-embedded printed circuit board.

2. Description of the Related Art

The various demands of the consumers are increasing regards current portable electronic devices. In particular, demands for multi-functionality, small size and light weight, fast processing speed, low cost, better portability, wireless Internet access in real time, and sophisticated design, etc., are placing a burden on developers, designers, and manufacturers to produce higher quality products.

The intensified competition is leading to rapid continuous releases of new models among different competitors, which in turn is increasing the burden on the persons involved. With the increase in variety of the functions provided by a product, the number of passive components is increasing in relation to the increase of active components, whereby the overall volume of a mobile terminal is also being increased.

In general, numerous active and passive components are mounted on the surface or surfaces of a circuit board, where many passive components are mounted on the surface or surfaces in the form of discrete chip capacitors to facilitate signal transfer between active components. In many related companies, continued development efforts are being focused on the PCB (printed circuit board) having embedded components, for high density mounting in an electronic system. The passive components embedded in the board may include resistors, condensers, and coils, which may be grouped according to the shape and form of the embedded components into conventional components, thin components, film components fabricated by printing or sputtering, and plated type components, etc. However, with the use of separate components, there is a limit in responding to the trends of lighter, thinner, and simpler products, and there may be problems in terms of efficient use of space and increased costs.

Among the types of passive components embedded in a board, numerous attempts are being made at embedding the thick film type (15-25 .mu.m) capacitor in a board, for which many patents are being published. The attempts are being continued, in particular, for implementing the characteristics of lightness, thinness, and simplicity in the electronic system. Methods of embedding a film type capacitor in a board include those that employ roll coating, sputtering, and sheet lamination, etc., where sheet lamination has been found effective in decreasing thickness tolerances and reducing costs.

FIGS. 1A to 1D are cross-sectional views representing a process of manufacturing a capacitor-embedded PCB by sheet lamination according to the related art.

As shown in FIG. 1A, inner electrodes 12a, 12b may be formed on either side of a core layer 11. In FIG. 1B, a leveling process may be performed using coating ink 13a, 13b. Afterwards, as illustrated in FIG. 1C, a pair of copper clad laminates 14a, 14d, in each of which a dielectric layer 142a, 142b and a copper layer 141a, 141b are stacked together, may be stacked such that the dielectric layers 142a, 142b face the coating ink 13a, 13b. In FIG. 1D, the copper layers 141a, 141b may be removed to form outer electrodes 15a, 15b.

In the capacitor-embedded PCB according to the related art, as illustrated in FIGS. 1A to 1D, if there are irregularities in the surface or surfaces of the coating ink 13a, 13b, portions of the dielectric layers 142a, 142b may fill in the irregularities, causing the dielectric layers 142a, 142b to have a non-uniform thickness, and affecting the reliability of the capacitor.

In addition to the above, there are several other methods for implementing an embedded capacitor. The decoupling capacitor, which serves to stabilize the power supply, may not require sensitive values with regard to capacitance tolerance. However, for the RF matching capacitor, not only the stability to temperature, but also the value of the capacitance itself, may require high tolerance. In recent times, the method of implementing an embedded capacitor using RCC type capacitor laminates is receiving much attention, as it allows relatively adequate thickness control. However, the material for the RCC type embedded capacitor provides very low stackability, so that an additional process may be required for leveling the surface on which the material for the RCC type embedded capacitor is stacked. A structural problem with the material for such RCC type embedded capacitor is that, in spite of the additional process of leveling the stacking surface, there can be high thickness deviations in the dielectric layers of the capacitor material with respect to the Cu pattern thickness or resin thickness at the stacking surface, leading to defects such as delamination at the stacking surface in severe cases. Also, the tenting method employed in forming the electrodes of the capacitor entails a limit to reducing deviations in capacitance in the overall embedded capacitor, as there can be high deviations in the electrodes of the embedded capacitor due to the etching process.

SUMMARY

An aspect of the invention provides a method of manufacturing a PCB, with which a capacitor can be embedded with the thicknesses of the dielectric layers kept uniform.

Another aspect of the invention provides a method of manufacturing a capacitor-embedded PCB, which includes fabricating a capacitor substrate having at least one inner electrode formed on one side of a dielectric layer; aligning a semi-cured insulation layer with one side of a core layer, and aligning the capacitor substrate with the semi-cured insulation layer such that the inner electrode faces the semi-cured insulation layer; and collectively stacking the core layer, the semi-cured insulation layer, and the capacitor substrate.

Fabricating the capacitor substrate may in turn include forming at least one outer electrode on the other side of the dielectric layer.

In certain embodiments, at least one of the outer electrode and the inner electrode can be formed by a subtractive method. In certain embodiments, at least one of the outer electrode and the inner electrode can be formed by an additive method.

After the operation of collectively stacking the core layer, the semi-cured insulation layer, and the capacitor substrate, the method may further include forming at least one outer electrode on the other side of the dielectric layer.

Yet another aspect of the invention provides a method of manufacturing a capacitor-embedded PCB, which includes fabricating a pair of capacitor substrates each having at least one inner electrode formed on one side of a dielectric layer; aligning a semi-cured insulation layer on either side of a core layer, and aligning the capacitor substrates with the semi-cured insulation layers respectively such that the inner electrodes face the semi-cured insulation layers; and collectively stacking the core layer, the semi-cured insulation layers, and the capacitor substrates.

Fabricating the pair of capacitor substrates may include forming at least one outer electrode on the other side of at least one of the dielectric layers.

In certain embodiments, at least one of the outer electrode and the inner electrode can be formed by a subtractive method. In certain embodiments, at least one of the outer electrode and the inner electrode can be formed by an additive method.

Also, after collectively stacking the core layer, the semi-cured insulation layers, and the capacitor substrates, the method may further include forming at least one outer electrode on the other side of at least one of the dielectric layers.

Additional aspects and advantages of the present invention will be set forth in part in the description which follows, and in part will be obvious from the description, or may be learned by practice of the invention.

BRIEF DESCRIPTION OF THE DRAWINGS

FIG. 3A, FIG. 3B, FIG. 3C, FIG. 3D, and FIG. 3E are cross-sectional views representing a process of manufacturing a capacitor-embedded PCB according to the first disclosed embodiment of the invention.

FIG. 4A, FIG. 4B, FIG. 4C, FIG. 4D, FIG. 4E, and FIG. 4F are cross-sectional views representing a process of manufacturing a capacitor-embedded PCB according to a second disclosed embodiment of the invention.

FIG. 6A, FIG. 6B, FIG. 6C, FIG. 6D, and FIG. 6E are cross-sectional views representing a process of manufacturing a capacitor-embedded PCB according to the third disclosed embodiment of the invention.

DESCRIPTION OF EMBODIMENTS

Figure 1A:
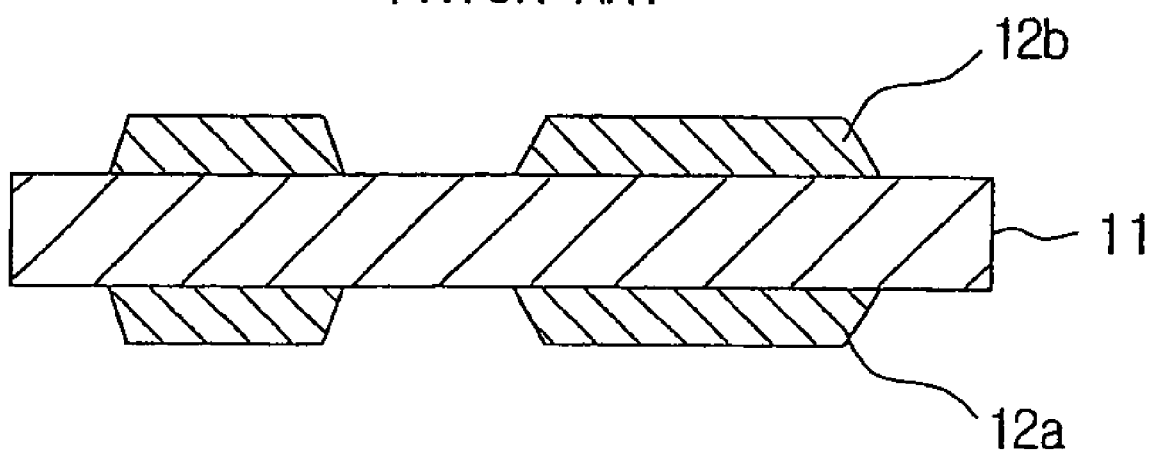
FIG. 1A, FIG. 1B, FIG. 1C, and FIG. 1D are cross-sectional views representing a process of manufacturing a capacitor-embedded PCB by sheet lamination according to the related art.
Figure 1B:
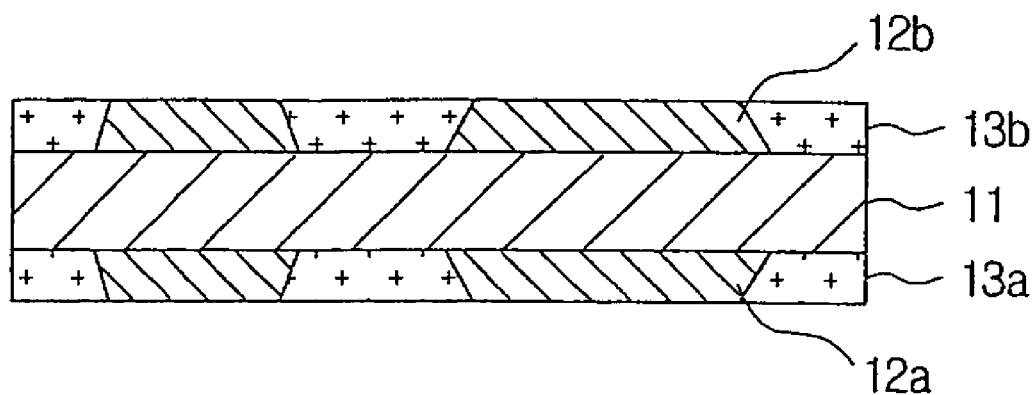
Figure 1C:
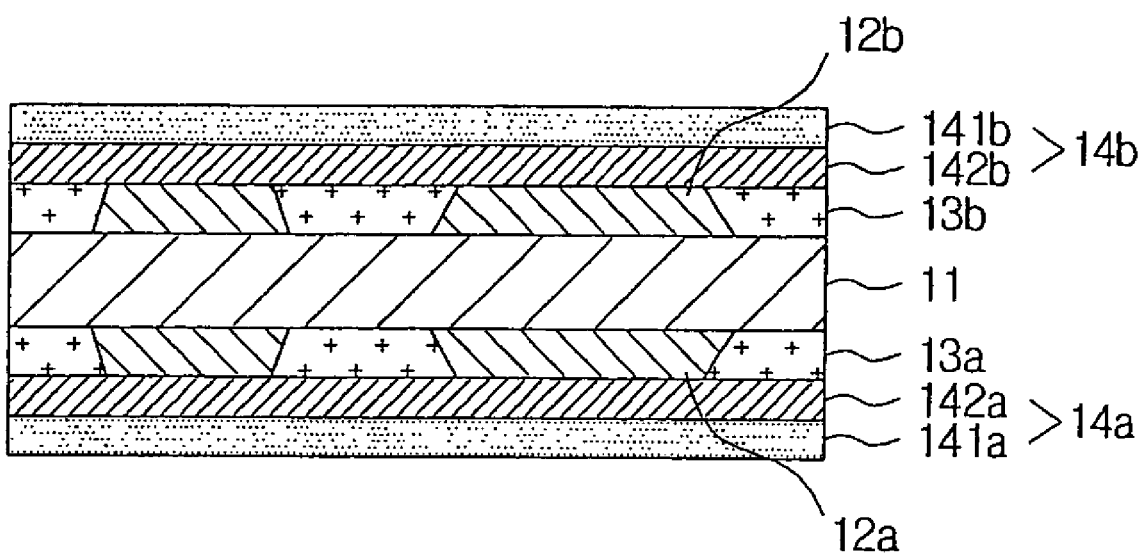
Figure 1D:
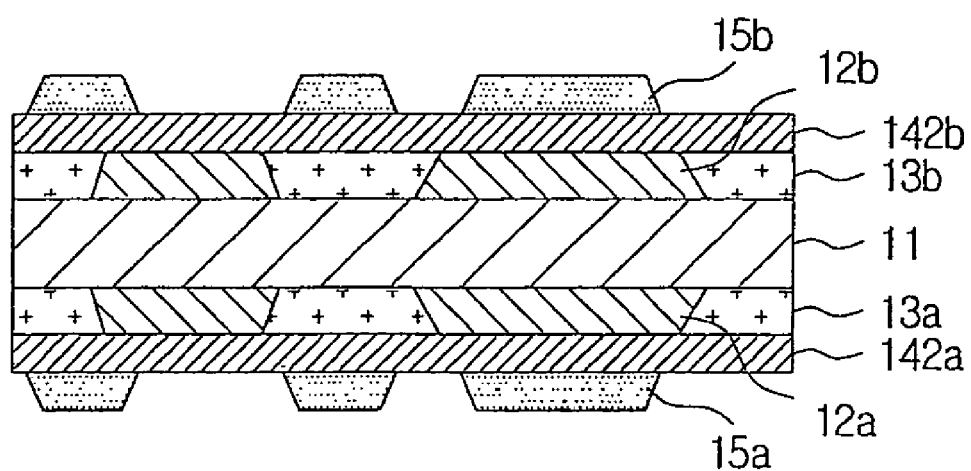

Certain embodiments of the invention will be described below in more detail with reference to the accompanying drawings. Those components that are the same or are in correspondence are rendered the same reference numeral regardless of the figure number, and redundant explanations are omitted.

Figure 2:
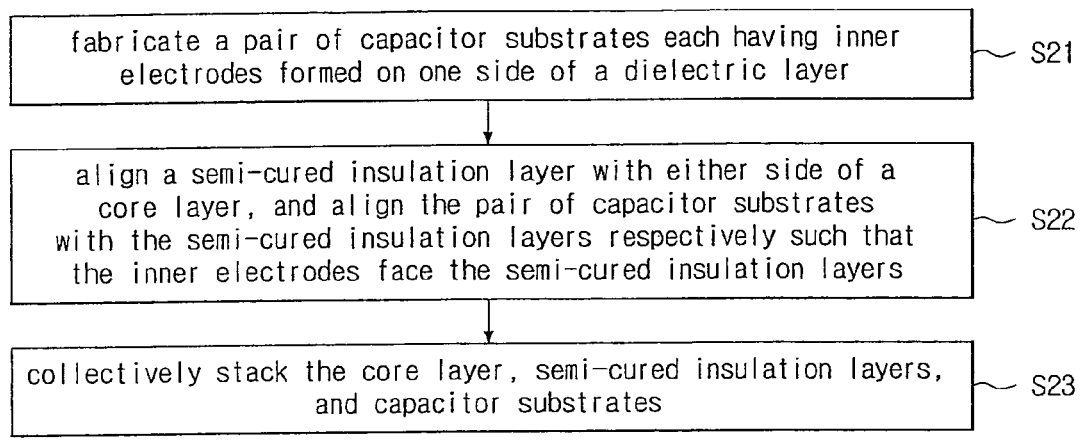
FIG. 2 is a flowchart of a method of manufacturing a capacitor-embedded PCB according to a first disclosed embodiment of the invention.

FIG. 2 is a flowchart of a method of manufacturing a capacitor-embedded PCB according to a first disclosed embodiment of the invention, and FIG. 3A to FIG. 3E are cross-sectional views representing a process of manufacturing a capacitor-embedded PCB according to the first disclosed embodiment of the invention. In FIGS. 3A to 3E are illustrated a first capacitor substrate 31, a first dielectric layer 311, first copper foils 312, first dry film 313, a first outer pattern 314a, a first inner pattern 314b, a first outer electrode 315a, a first inner electrode 315b, a second capacitor substrate 32, a second dielectric layer 321, second copper foils 322, second dry film 323, a second outer pattern 324a, a second inner pattern 324b, a second outer electrode 325a, a second inner electrode 325b, a core layer 33, semi-cured insulation layers 34, capacitors 35, and a capacitor-embedded PCB 30.

Operation S21 may include fabricating a pair of capacitor substrates which each have an inner electrode formed on one side of a dielectric layer.

The pair of capacitor substrates in this particular embodiment are the first capacitor substrate 31 and the second capacitor substrate 32. While the first and second capacitor substrates 31, 32 may have completely identical, mirror-image shapes, they may just as well have the electrodes or patterns formed on different positions.

Figure 3A:
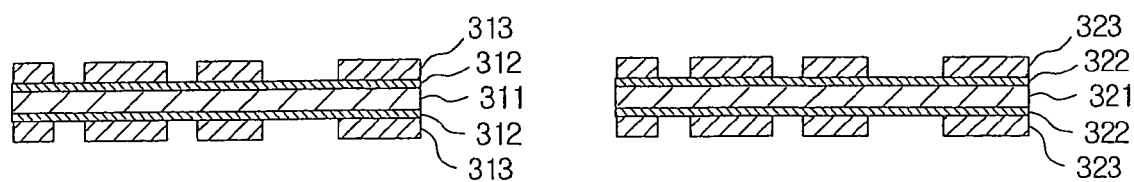
Figure 3B:
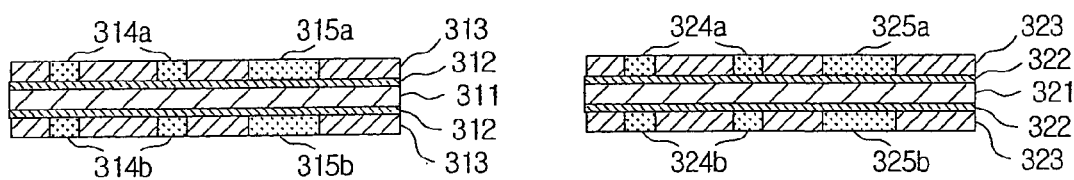
Figure 3C:
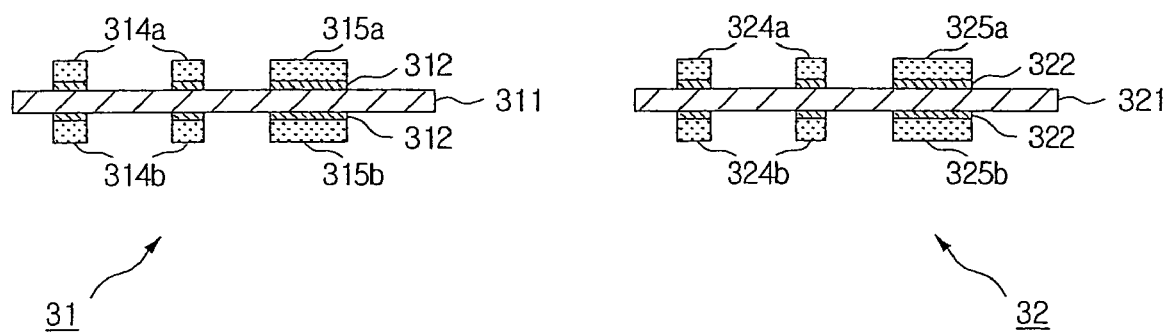

The process for fabricating the first and second capacitor substrates 31, 32 can be as shown in FIGS. 3A to 3C. The method for fabricating the second capacitor substrate 32 may be substantially the same as that for fabricating the first capacitor substrate 31. As such, the descriptions that follow will focus on the fabrication of the first capacitor substrate 31.

For the first capacitor substrate 31, first dry film 313 may be stacked on a copper clad laminate, in which first copper foils 312 are stacked on both sides of a first dielectric layer 311, and portions of the first dry film 313 may be removed in consideration of the portions where the circuit patterns will be formed. The first dielectric layer 311 may later serve as the dielectric membrane in a capacitor, and thus may include a material having a suitable permittivity, such as ceramics, etc. After thus stacking first dry film 313 over a copper clad laminate having first copper foils 312 stacked on both sides of a first dielectric layer 311, and performing exposure and development processes in consideration of the portions where the circuit patterns and the electrodes of the capacitor are to be formed, a unit may be obtained that has a cross-section similar to that shown in FIG. 3A. The thickness of the first copper foils 312 can be made very thin, to the level of several micrometers. The copper foils can be given low thicknesses by etching.

The first dielectric layer 311 can be in a cured state or in a semi-cured state. If the first dielectric layer 311 is in a cured state, the thickness of the first dielectric layer 311 can be kept constant even after proceeding with the subsequent processes, so that the capacitor can be manufactured with high reliability. On the other hand, the first dielectric layer 311 in a semi-cured state can be more flexible, to prevent cracking, etc., that may otherwise occur during the manufacturing process.

Performing plating by an additive method, as illustrated in FIG. 3B, may result in a first inner pattern 314b, first outer pattern 314a, first inner electrode 315b, and first outer electrode 315a being plated on. Electroplating may generally be employed for the plating method, while copper (Cu) may generally be used for the plating metal. A semi-additive method can be regarded, in a larger sense, as being encompassed by the concept of an additive method.

Afterwards, the first dry film 313 may be removed, and soft etching may be performed, at which portions of the first copper foils 312 may be removed to complete the first capacitor substrate 31, as illustrated in FIG. 3C.

While this embodiment is described using an example in which the first inner electrode 315b and the first outer electrode 315a are formed by an additive method, the first inner electrode 315b and the first outer electrode 315a can just as well be formed by a subtractive method in other embodiments. Furthermore, at least one of the first inner electrode 315b and first outer electrode 315a may be formed by an additive method, with the remaining electrodes formed by a subtractive method.

Forming an electrode (in the case of this embodiment, an inner electrode or an outer electrode) of a capacitor using an additive method may guarantee a certain degree of accuracy, whereby capacitors may be formed to a desired yield rate. On the other hand, forming an electrode of a capacitor using a subtractive method may entail simpler processes and lower costs. In cases where the tolerance in the capacitance of the capacitor is high, it can be advantageous to form the electrodes using a subtractive method. Since it is possible to adjust the capacitance of a capacitor if the area is accurately controlled for just one of a pair of electrodes in the capacitor, it can be advantageous to use an additive method for just one of the outer electrode and the inner electrode.

Operation S22 may include aligning a pair of semi-cured insulation layers on either side of a core layer, and aligning a capacitor substrate with each semi-cured insulation layer such that the inner electrodes face the semi-cured insulation layer.

Figure 3D:
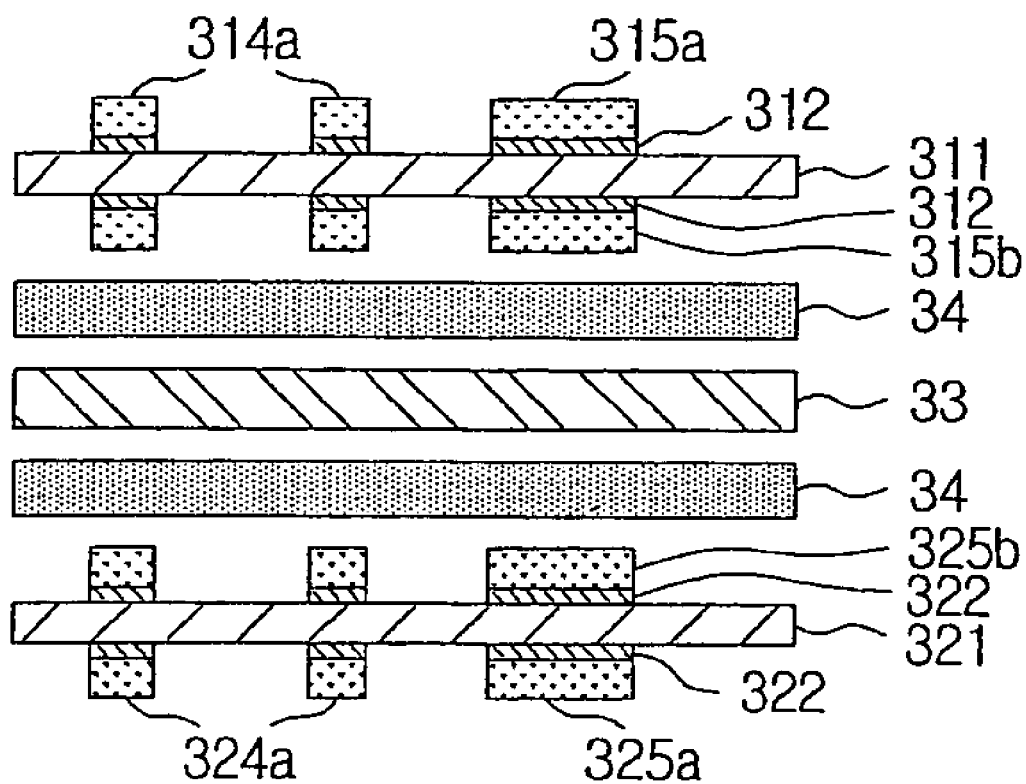

An example of these procedures can be described with reference to FIG. 3D. The semi-cured insulation layers 34 can be arranged substantially symmetrically on both sides of the core layer 33, with a pair of capacitor substrates 31, 32 arranged on the outer sides.

In particular, the first and second capacitor substrates 31, 32 can be aligned such that the first and second inner electrodes 315b, 325b face the directions of the semi-cured insulation layers 34.

The core layer 33 may serve to provide a degree of stiffness to the capacitor-embedded PCB 30, for which Prepreg may generally be used. Prepreg is structured to have glass fibers and resin coupled to each other.

The semi-cured insulation layers 34 can be made mainly of a resin, and in the stacking process may couple the core layer 33 and the first and second capacitor substrates 31, 32 together.

Operation S23 may include collectively stacking the core layer, semi-cured insulation layers, and capacitor substrates together. Here, collective stacking refers to a stacking process in which even amounts of force are applied from both sides, for example, by using a mechanical press. For better results, it is typical to apply heat during the stacking process.

Proceeding with operation S13 can result in the manufacture of a capacitor-embedded PCB 30, an example of which is illustrated in FIG. 3E. The first and second outer electrodes 315a, 325a may have already been formed in operation S11, and thus they may not have to be formed after operation S13.

The processes described above for this embodiment can be used to form a capacitor-embedded PCB 30, in which capacitors 35 are formed. Here, the first and second dielectric layers 311, 321 of each of the capacitors 35 are not subject to deformation, so that high reliability may be obtained.

The processes after operation S13 can be similar to processes for manufacturing a typical PCB.

FIG. 4A to FIG. 4F are cross-sectional views representing a process of manufacturing a capacitor-embedded PCB according to a second disclosed embodiment of the invention.

In FIGS. 4A to 4F are illustrated a first capacitor substrate 41, a first dielectric layer 411, first copper foils 412, first dry film 413a, 413b, a first outer pattern 414a, a first inner pattern 414b, a first outer electrode 415a, a first inner electrode 415b, a second capacitor substrate 42, a second dielectric layer 421, second copper foils 422, second dry film 423a, 423b, a second outer pattern 424a, a second inner pattern 424b, a second outer electrode 425a, a second inner electrode 425b, a core layer 43, semi-cured insulation layers 44, capacitors 45, and a capacitor-embedded PCB 40. The core layer 43, first dielectric layer 411, and semi-cured insulation layers 44 can be made of the same or similar materials as those in the embodiment described with reference to FIGS. 3A to 3E.

Figure 4A:
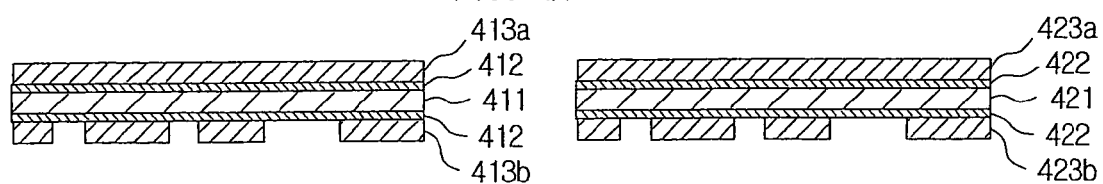
Figure 4B:
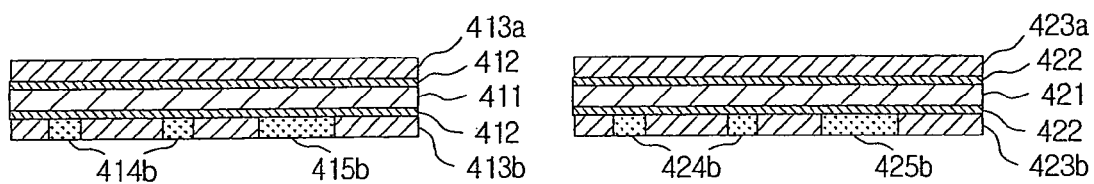
Figure 4C:
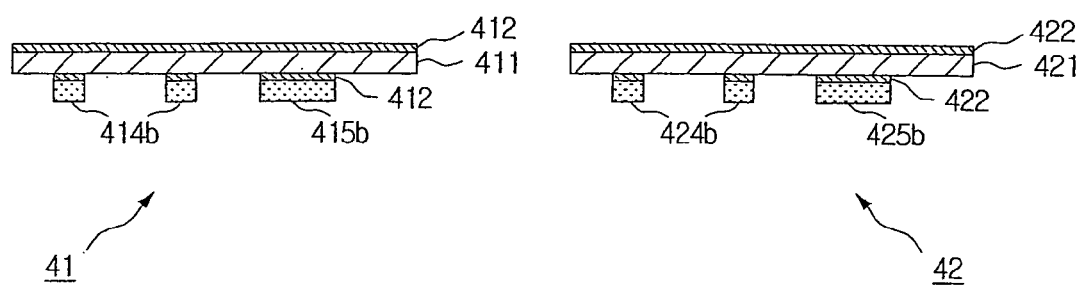

FIGS. 4A to 4C illustrate processes for fabricating a pair of capacitor substrates 41, 42, on each of which inner electrodes 415b, 425b are formed. The first capacitor substrate 41 and the second capacitor substrate 42 can be produced by a substantially same fabrication process. As such, for this embodiment, the descriptions that follow will focus on the fabrication of the first capacitor substrate 41.

The fabrication of the first capacitor substrate 41 may include, first, preparing a copper clad laminate that has first copper foils 412 stacked on either side of a first dielectric layer 411, and stacking first dry film 413a, 413b over the first copper foils 412, as illustrated in FIG. 4A. The first dry film 413a, 413b may be of a photosensitive material. Portions of the first dry film 413a, 413b can be removed by exposure and development processes in consideration of the portions where a first inner electrode 415b is to be formed. Afterwards, an additive type plating can be performed, to result in the forming of a first inner electrode 415b and a first inner pattern 414b, as illustrated in FIG. 4B. In certain embodiments, the first inner electrode 415b and the first inner pattern 414b can be formed by a subtractive method. Using a subtractive method may provide the benefits of simpler processes and lower costs.

Afterwards, the first dry film 413a, 413b may be removed, to complete the first capacitor substrate 41, as illustrated in FIG. 4C.

FIG. 4D illustrates an operation of aligning a core layer 43, semi-cured insulation layers 44, and the first and second capacitor substrates 41, 42. As shown in FIG. 4D, the semi-cured insulation layers 44 and the first and second capacitor substrates 41, 42 can be aligned symmetrically about the core layer 43. Here, the first and second inner electrodes 415b, 425b of the first and second capacitor substrates 41, 42 may be made to face the semi-cured insulation layers 44.

Figure 4E:
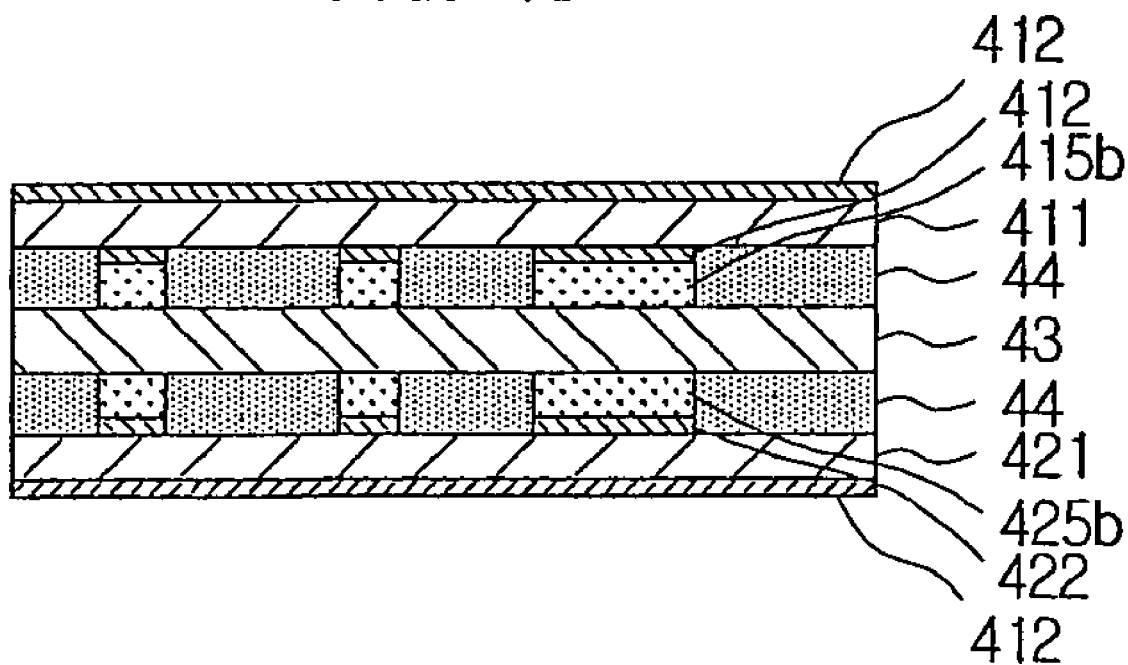

FIG. 4E illustrates an operation of collectively stacking the core layer 43, semi-cured insulation layers 44, and first and second capacitor substrates 41, 42. By way of the semi-cured insulation layers 44, the core layer 43 and the first and second capacitor substrates 41, 42 can be stacked together, for example, using a mechanical press and while applying heat. The semi-cured insulation layers 44 may be of a moldable material, and thus may readily be deformed during the stacking. Therefore, the stacking may be performed without having the first and second dielectric layers 411, 421 within the first and second capacitor substrates 41, 42 being deformed. Later, when the first and second outer electrodes 415a, 425a are formed to produce capacitors 45, as illustrated in FIG. 4F, the capacitors 45 will provide high reliability.

Figure 4F:
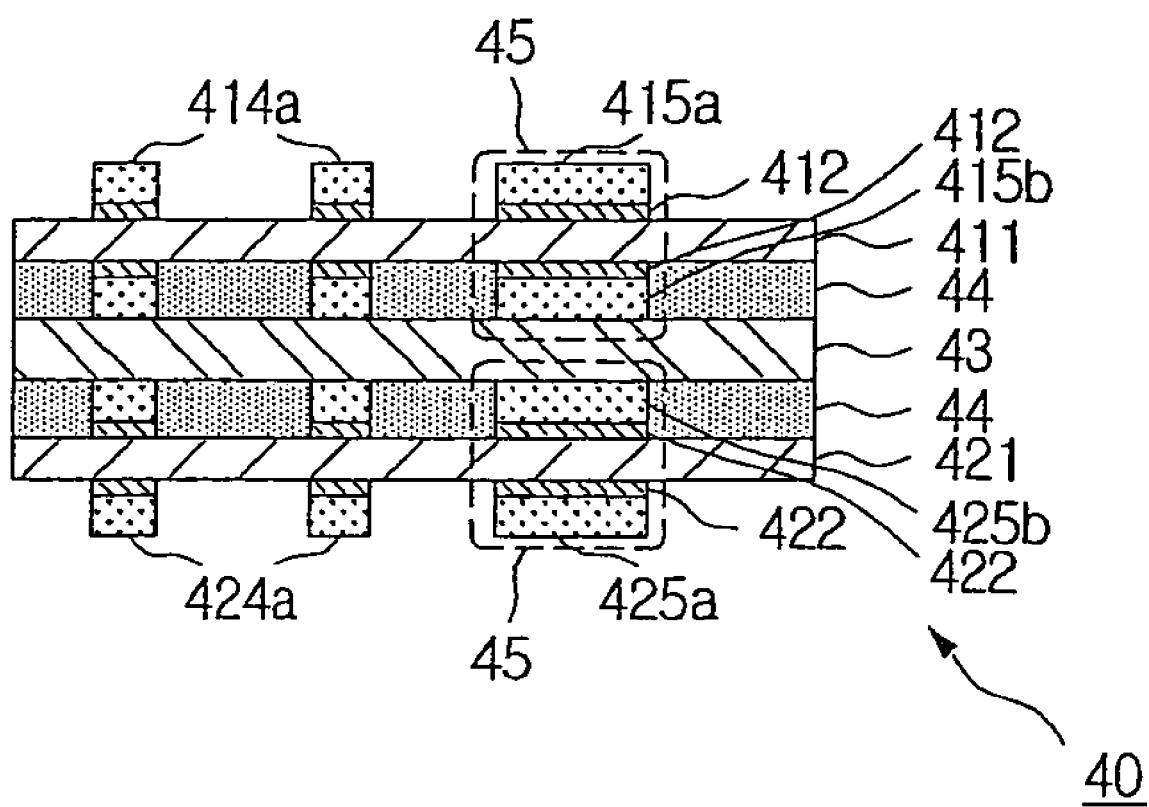

FIG. 4F illustrates a process of forming the first and second outer electrodes 415a, 425a. The first and second outer electrodes 415a, 425a can be formed by an additive method over the first and second copper foils 412, 422 that were not removed in the process illustrated in FIG. 4E. With the completion of this process, capacitors 45 may be produced.

While the embodiment described with reference to FIGS. 3A through 3E may have the outer electrodes and inner electrodes formed at the same time, in this embodiment described with reference to FIGS. 4A through 4F, the first and second inner electrodes 415b, 425b may be formed in the processes illustrated in FIGS. 4A to 4C, whereas the first and second outer electrodes 415a, 425a may be formed in the process illustrated in FIG. 4F. One reason for not forming the outer electrodes and inner electrodes at the same time may be so that the first and second copper foils 412, 422 illustrated in FIG. 4E may serve as a sort of frame, supporting the first capacitor substrate 41 and the second capacitor substrate 42.

When the first and second copper foils 412, 422 no longer need to function as a frame, the first and second outer electrodes 415a, 425a can be formed, for example by a subtractive method, as illustrated in FIG. 4F, to complete the capacitor-embedded PCB 40.

Figure 5:
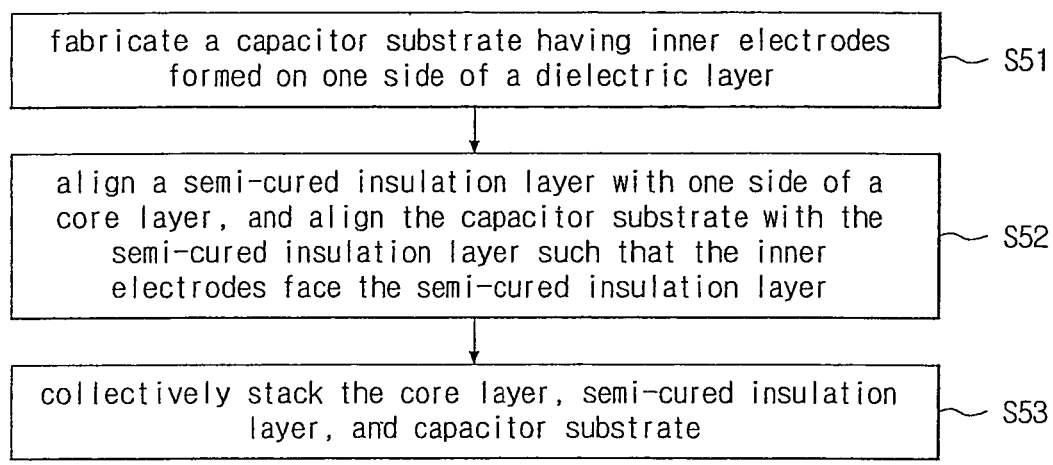
FIG. 5 is a flowchart of a method of manufacturing a capacitor-embedded PCB according to a third disclosed embodiment of the invention.

FIG. 5 is a flowchart of a method of manufacturing a capacitor-embedded PCB according to a third disclosed embodiment of the invention, and FIG. 6A to FIG. 6E are cross-sectional views representing a process of manufacturing a capacitor-embedded PCB according to the third disclosed embodiment of the invention. In FIGS. 6A to 6E are illustrated a capacitor substrate 51, a dielectric layer 511, copper foils 512, dry film 513, an outer pattern 514a, an inner pattern 514b, an outer electrode 515a, an inner electrode 515b, a core layer 53, a semi-cured insulation layer 54, a capacitor 55, and a capacitor-embedded PCB 40.

Figure 6A:
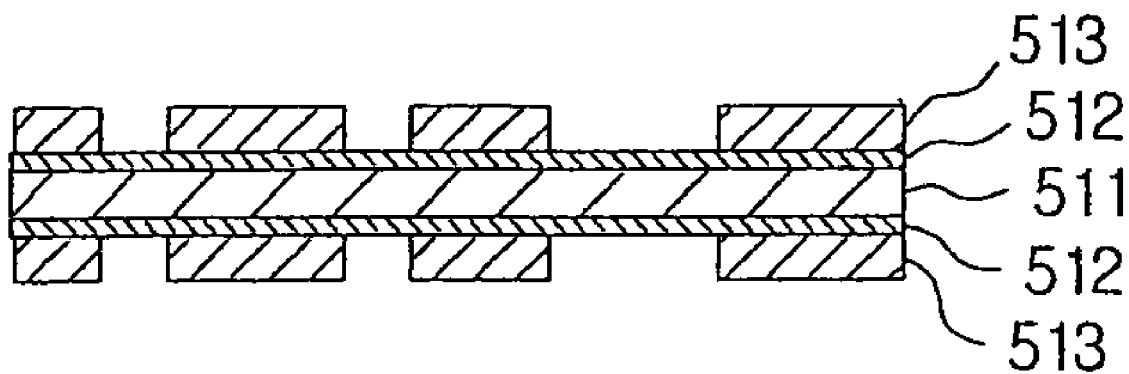
Figure 6B:
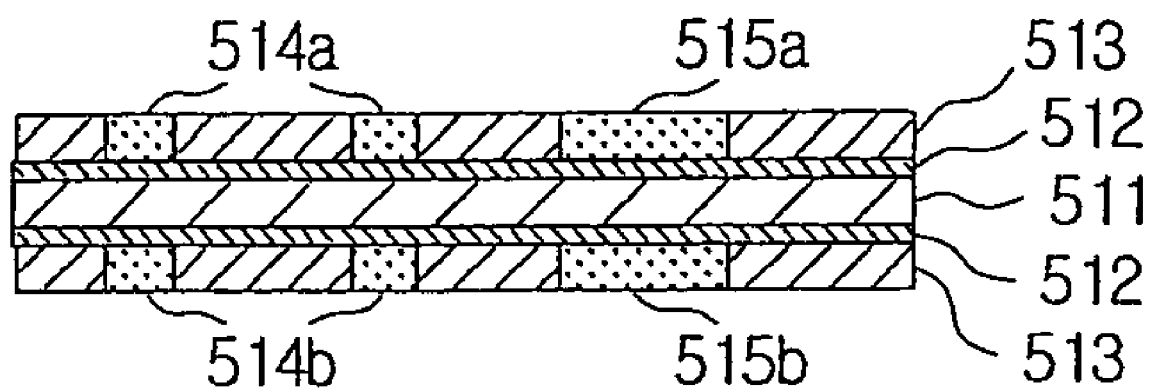
Figure 6C:
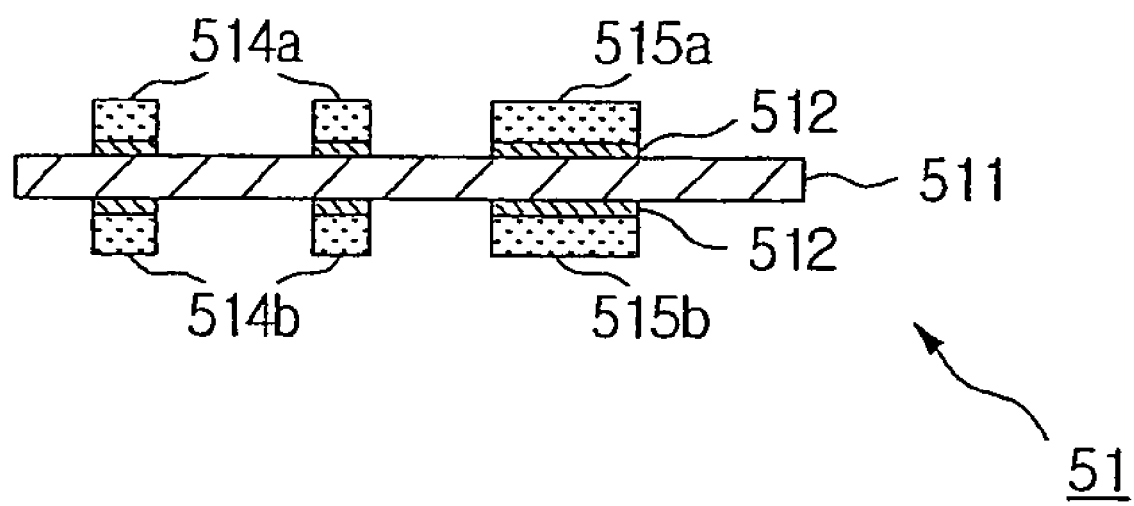

Operation S51 may include fabricating a capacitor substrate 51 that has an inner electrode formed on one side of a dielectric layer 511, where FIGS. 6A to 6C illustrate corresponding processes.

By the procedures illustrated in FIGS. 6A to 6C, the capacitor substrate 51 may be fabricated on which an outer electrode 515a and an inner electrode 515b are formed.

First, a copper clad laminate may be prepared that has a copper foil 512 stacked on either side of a dielectric layer 511, and an outer pattern 514a, inner pattern 514b, outer electrode 515a, and inner electrode 515b may be formed using an additive method. In this embodiment, the outer pattern 514a and the outer electrode 515a can be formed at the same time as when the inner pattern 514b and the inner electrode 515b are formed. However, the outer pattern 514a and outer electrode 515a may just as well be formed after forming the inner pattern 514b and inner electrode 515b.

While this embodiment is described using an example in which the inner electrode 515b and the outer electrode 515a are formed by an additive method, the inner electrode 515b and the outer electrode 515a can just as well be formed by a subtractive method in other embodiments. Furthermore, at least one of the inner electrode 515b and outer electrode 515a may be formed by an additive method, with the remaining electrodes formed by a subtractive method.

Forming an electrode (in the case of this embodiment, an inner electrode or an outer electrode) of a capacitor using an additive method may guarantee a certain degree of accuracy, whereby capacitors may be formed to a desired yield rate. On the other hand, forming an electrode of a capacitor using a subtractive method may entail simpler processes and lower costs. In cases where the tolerance in the capacitance of the capacitor is high, it can be advantageous to form the electrodes using a subtractive method. Since it is possible to adjust the capacitance of a capacitor if the area is accurately controlled for just one of a pair of electrodes in the capacitor, it can be advantageous to use an additive method for just one of the outer electrode and the inner electrode.

Operation S52 may include aligning a semi-cured insulation layer 54 at one side of a core layer 53, and aligning the capacitor substrate 51 with the semi-cured insulation layer 54 such that the inner electrode 515b faces the semi-cured insulation layer 54.

Figure 6D:
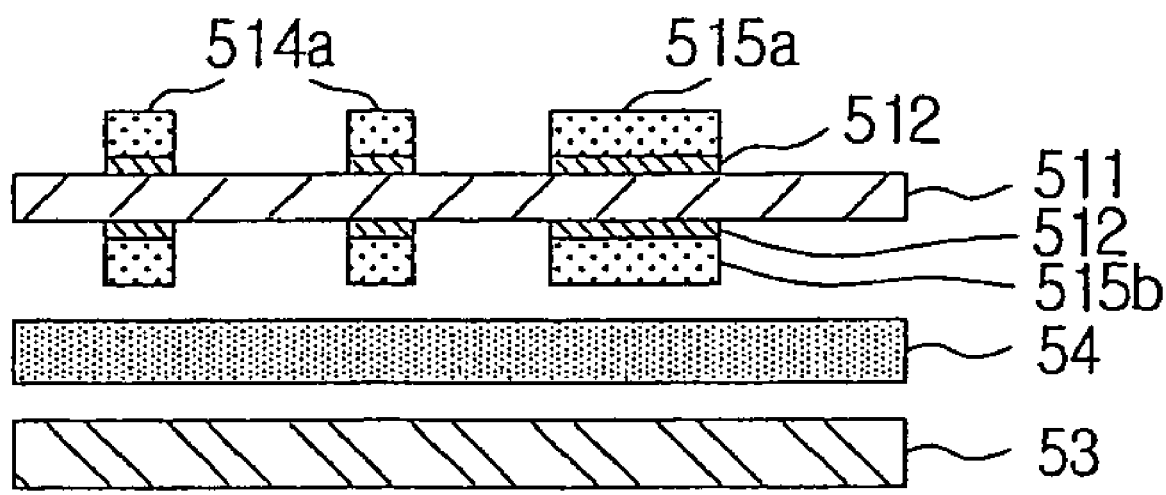

FIG. 6D illustrates the core layer 53, semi-cured insulation layer 54, and capacitor substrate 51 aligned in order. The semi-cured insulation layers 54 can be made mainly of a resin, and can have a rigidity lower than that of the dielectric layer 511. Prepreg may generally be used for the core layer 53.

Operation S53 may include collectively stacking the core layer 53, semi-cured insulation layer 54, and capacitor substrate 51. As a result of the collective stacking, a capacitor-embedded PCB 50 may be manufactured such as that illustrated in FIG. 6E. As seen in the drawing, a capacitor 55 can be embedded in the PCB 50.

In embedding the capacitor 55 as described for the embodiment with reference to FIGS. 6A to 6E, there may not be deformations in the dielectric layer 511. This is because, since the semi-cured insulation layer 54 has a lower rigidity than does the dielectric layer 511, the semi-cured insulation layer 54 may readily be deformed during the collective stacking process, to serve as an adhesive layer.

Figure 7A:
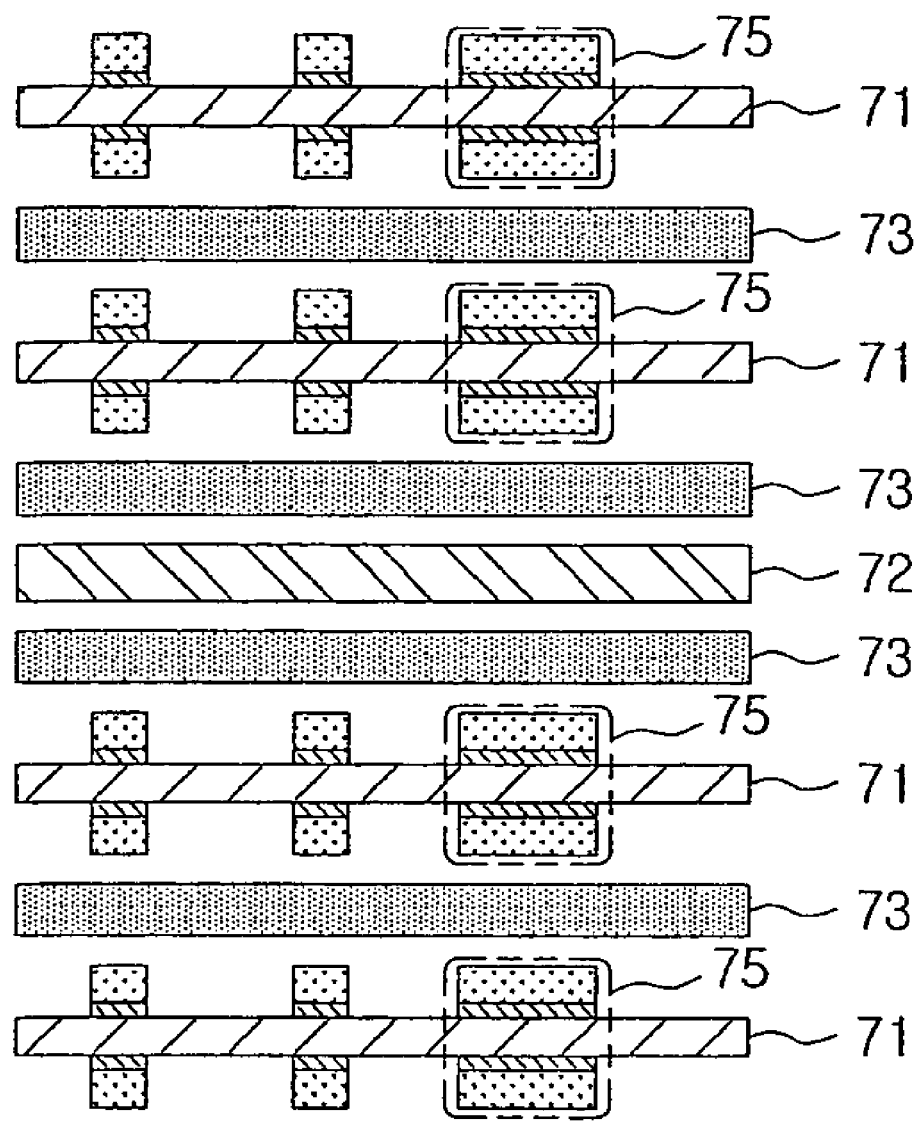
FIG. 7A and FIG. 7B are cross-sectional views representing a process of manufacturing a capacitor-embedded PCB according to a fourth disclosed embodiment of the invention.
Figure 7B:
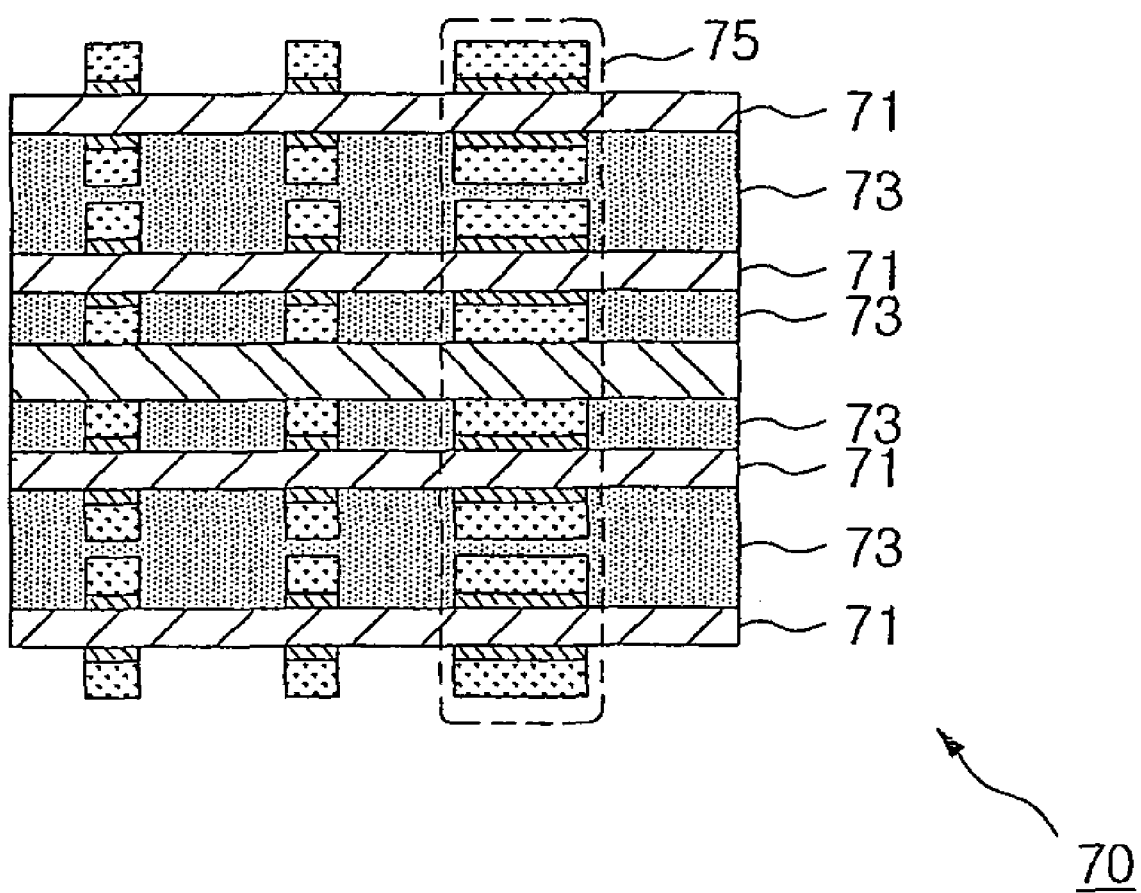

FIG. 7A and FIG. 7B are cross-sectional views representing a process of manufacturing a capacitor-embedded PCB according to a fourth disclosed embodiment of the invention. In FIGS. 7A and 7B are illustrated capacitor substrates 71, a core layer 72, semi-cured insulation layers 73, and a capacitor-embedded PCB 70.

This embodiment provides an example of a process for manufacturing a PCB 70 having an embedded capacitor, in which multiple semi-cured insulation layers 73 and capacitor substrates 71 may be aligned alternately on either side of a core layer 72 and stacked collectively.

As set forth above, instead of forming inner electrodes on the core layer according to the related art, embodiments of the invention have the inner and outer electrodes formed on the dielectric layers before stacking onto the core layer, whereby the various problems caused by forming the inner electrode on the core layer can be eliminated. Also, in those cases where insulation layers are used in a cured state, the deviations in thickness of the dielectric layers which may occur during the stacking onto the core layer can be minimized.

By manufacturing a PCB having an embedded capacitor without losses in the dielectric layers, the capacitor having a particular capacitance can be implemented with high reliability. Furthermore, the inner and outer electrodes may be formed by an additive method to increase the precision of the capacitor. In addition, the process of applying the coating ink, included in methods according to the related art, may be omitted, thereby reducing processing costs.

As such, embodiments of the invention can resolve certain problems found in the material used for the RCC type embedded capacitor, to remove the additional flat-coating process applied to the stacking surface, improve thickness deviations in the dielectric layers in the embedded capacitor, and resolve the problem of delamination at the stacking surface. Forming the electrodes of the embedded capacitor may also be formed by employing an additive process, instead of the conventional etching method, to reduce electrode deviations and therefore reduce deviations in the overall capacitance of the embedded capacitor (EC).

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a capacitor-embedded printed circuit board, the method comprising:

providing a pair of copper clad laminates on either side of a dielectric layer, the copper clad laminates having a copper layer stacked thereon;

fabricating a capacitor substrate having at least one inner electrode formed on one side of the dielectric layer, by stacking the inner electrode on one side of each of the copper clad laminates by an additive method and then removing the copper layer on one side of each of the copper clad laminates;

aligning a semi-cured insulation layer with one side of a core layer, and aligning the capacitor substrate with the semi-cured insulation layer such that the inner electrode faces the semi-cured insulation layer; and collectively stacking the core layer, the semi-cured insulation layer, and the capacitor substrate.

2. The method of claim 1, further comprising forming at least one outer electrode on the other side of the dielectric layer.

3. The method of claim 2, wherein the outer electrode is formed by an additive method or a subtractive method.

4. The method of claim 1, wherein the fabricating the capacitor substrate comprises:

stacking a dry film on one side of each of the copper clad laminates;

selectively removing a portion of the dry film corresponding to a location where the inner electrode is to be formed;

forming an inner electrode on one side of each of the copper clad laminates by way of plating;

removing the dry film; and removing the copper layer on one side of each of the copper clad laminates.

5. The method of claim 4, wherein the removing of the copper layer comprises soft-etching the copper layer on one side of each of the copper clad laminates.

* * * * *